United States Patent [19]

Okamoto et al.

[11] Patent Number: 4,602,183

[45] Date of Patent: Jul. 22, 1986

[54] SURFACE ACOUSTIC WAVE DEVICE WITH A 3-PHASE UNIDIRECTIONAL TRANSDUCER

[75] Inventors: Takeshi Okamoto; Shoichi Minagawa; Teruo Niitsuma, all of Tokyo, Japan

[73] Assignee: Clarion Co., Ltd., Tokyo, Japan

[21] Appl. No.: 509,755

[22] Filed: Jun. 30, 1983

[30] Foreign Application Priority Data

Jul. 6, 1982 [JP] Japan ................................ 57-118060

[51] Int. Cl.$^4$ ............................................. H03H 9/42
[52] U.S. Cl. ................................. 310/313 B; 333/154; 333/195; 333/151; 333/193
[58] Field of Search ............... 333/193, 194, 195, 150, 333/151, 152, 153, 154; 310/313 R, 313 B, 313 C, 313 D

[56] References Cited

U.S. PATENT DOCUMENTS

| | | | |
|---|---|---|---|
| 4,087,714 | 5/1978 | La Rosa et al. | 310/313 B |
| 4,194,171 | 3/1980 | Jelks | 310/313 B X |
| 4,206,380 | 6/1980 | Hazama et al. | 310/313 B |
| 4,267,533 | 5/1981 | Dempsey et al. | 310/313 B X |
| 4,449,107 | 5/1984 | Asai et al. | 333/193 X |
| 4,491,811 | 1/1985 | Niitsuma et al. | 333/194 X |

FOREIGN PATENT DOCUMENTS

| | | | |
|---|---|---|---|
| 2805413 | 8/1978 | Fed. Rep. of Germany | 333/196 |
| 2069278 | 8/1981 | United Kingdom | 333/195 |

Primary Examiner—James B. Mullins
Assistant Examiner—Benny T. Lee
Attorney, Agent, or Firm—Flynn, Thiel, Boutell & Tanis

[57] ABSTRACT

A surface acoustic wave device comprises an elastic substrate; a lower electrode provided on the elastic substrate; a piezo-electric film covering the lower electrode; and plural upper electrodes which each include plural electrode fingers and are aligned with and spaced from each other on the piezoelectric film in confrontation with the lower electrode.

12 Claims, 8 Drawing Figures

PHASE SHIFTER

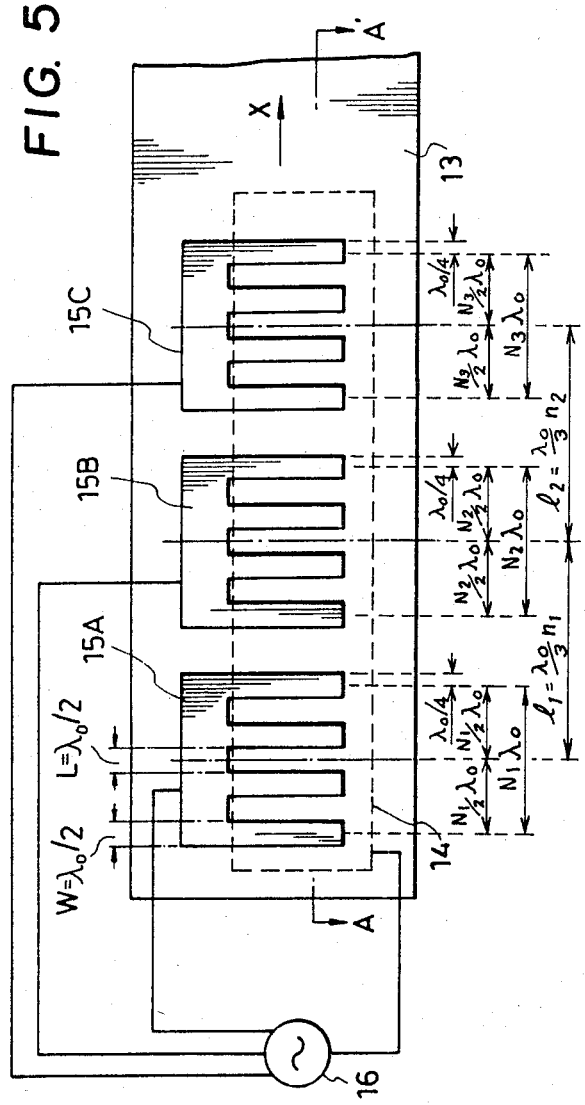
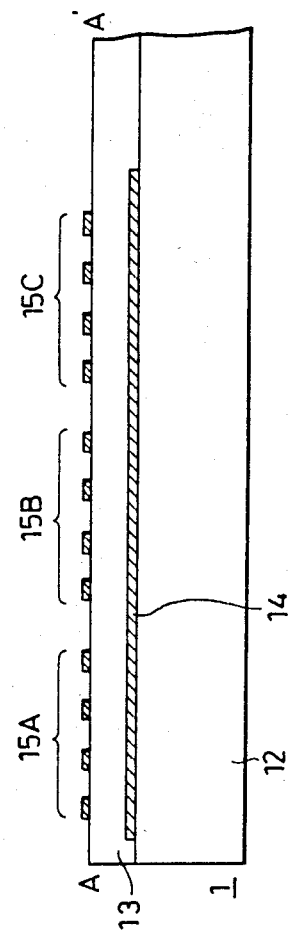
FIG. 5(a)
FIG. 5(b)

SURFACE ACOUSTIC WAVE DEVICE WITH A 3-PHASE UNIDIRECTIONAL TRANSDUCER

FIELD OF THE INVENTION

This invention relates to a surface acoustic wave device, including mono-directional transducers.

BACKGROUND OF THE INVENTION

A surface acoustic wave device mainly consists of a piezoelectric substrate made of a piezoelectric single crystal material such as lithium niobate ($LiNbO_3$), a piezoelectric ceramic material or alternatively a combination of a non-piezoelectric plate and a piezoelectric film deposited thereon, for example, and can convert an electric signal to a surface acoustic wave by means of a transducer provided on the piezoelectric substrate and can propagate the surface acoustic wave along the surface of the substrate. It is now employed as filters and other various electronic parts.

FIG. 1 shows a filter as an example of such electronic parts, in which reference numeral 1 designates a piezoelectric substrate. Reference numeral 2 designates an input transducer consisting of a pair of interdigitating comb-shaped electrodes 2A and 2B. Reference numeral 3 denotes an output transducer consisting of a pair of interdigitating comb-shaped electrodes 3A and 3B. When an electric signal is applied to the input transducer 2, it is converted to a surface acoustic wave and travels along the surface of the piezoelectric substrate 1. When the surface acoustic wave reaches the output transducer 3, it is reconverted to an electric signal and is outputted to a load 5. The combshaped electrodes 2A, 2B and 3A, 3B of the input and output transducers are so-called normalized electrodes wherein each electrode finger width W and each space L between respective adjacent interdigitating electrode fingers are $\lambda_0/4$, respectively, where $\lambda_0$ is the wavelength of the center frequency $f_0$ of a surface acoustic wave to be employed.

A filter including the input and output transducers with the construction of FIG. 1 is subject to electromechanical conversion loss, and is thereby large in filtering loss, because each of the transducers 2 and 3 operates as a so-called bi-directional transducer so as to propagate surface acoustic waves in both the right and left directions.

To alleviate the drawback, there is proposed a unidirectional or mono-directional transducer which is arranged to propagate a surface acoustic wave in a single direction along the surface of the piezoelectric substrate 1. A known example of the mono-directional transducer is shown in FIG. 2, wherein a 120° (or 90°) phase shifter is provided. Another example is shown in FIG. 3, wherein a reflector is provided.

The transducer of FIG. 2 includes comb-shaped electrodes 6A, 6B and 6C to which a signal source 4 is connected via a 120° phase shifter 7 so as to actuate the respective electrodes 6A, 6B and 6C with a 120° phase difference, respectively, thereby propagating surface acoustic waves in only one direction.

This mono-directional transducer, however, must be formed with two-level crossings 8 by interposing spaces or insulative films between at least two electrodes 6B and 6C, for example, which are different in their phases. This causes a very complex manufacturing process, a worse productivity of the device and an increase of the production cost.

The transducer of FIG. 3 comprises a power supply section and a reflecting section including normalized comb-shaped electrodes 9A and 9B, respectively, and a common electrode 10. The power supply section 9A is connected to the signal source 4 via a matching circuit 11 while the reflecting section 9B is connected to a reactance circuit 12 so that the reflecting section 9B terminating at the reactance circuit 12 reflects leftwardly travelling components of surface acoustic waves which propagate in both the right and left directions from the power supply section 9A, and thereby allows the surface acoustic waves to travel merely in the right direction.

This mono-directional transducer, however, comprises the normalized electrodes 9A and 9B whose electrode finger width W and whose space L between adjacent electrode fingers are each $\lambda_0/4$, respectively. Thus, the surface acoustic waves reflected by the respective electrode finger tips of the electrodes 9A and 9B coincide with each other in their phases, thereby enlarging interelectrode reflections. This worsens the nature of the device.

To alleviate the drawback of the transducer employing the reflector of FIG. 3, there is proposed a double-electrode transducer as shown in FIG. 4. In this transducer, each electrode finger of the interdigitating comb-shaped electrodes 2A and 2B is divided into two parts so that each electrode finger width W and each space L between the electrodes is $\lambda_0/8$.

This structure certainly reduces influences by reflecting waves because the reflecting waves at the respective electrode finger tips are different in their phases by 180°, that is, they are in opposite phases, and counteract each other. However, it requires extremely high accuracy upon making the electrodes because the higher the frequency, the smaller the wavelength $\lambda$ becomes. If the center frequency is 1 GHz and the piezo-electric substrate is made of lithium noibate, which is most widely adopted, $\lambda_0/4$ is 0.87 $\mu$m and $\lambda_0/8$ is 0.44 $\mu$m, approximately. Such extremely small measurement makes it difficult to constantly fabricate the devices with uniform characteristics even if a recent precision working technique is employed.

SUMMARY OF THE INVENTION

It is therefore an object of the invention to provide a mono-directional transducer not involving the drawbacks involved in the prior art. To this end, the surface acoustic wave device according to the invention comprises a piezoelectric substrate consisting of an elastic base plate and a piezoelectric film deposited on the elastic base plate; a lower electrode provided on the elastic base plate; and a plurality of upper electrodes aligned with and spaced from each other on the piezoelectric film.

BRIEF DESCRIPTION OF THE DRAWINGS

FIGS. 5(a) and 5(b) are a plan view and a sectional view showing an embodiment of the invention.

DETAILED DESCRIPTION

Figure 1:
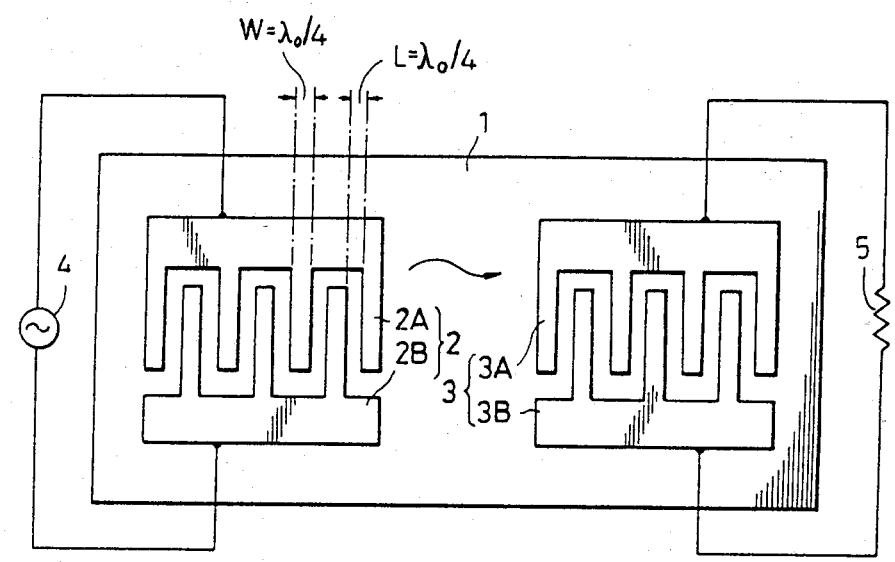
FIGS. 1, 3 and 4 are plan views showing conventional devices.
Figure 2:
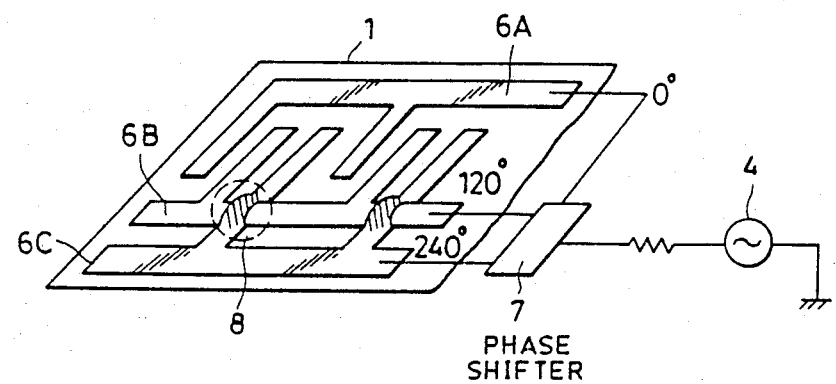
FIG. 2 is a perspective view showing a conventional device.
Figure 3:
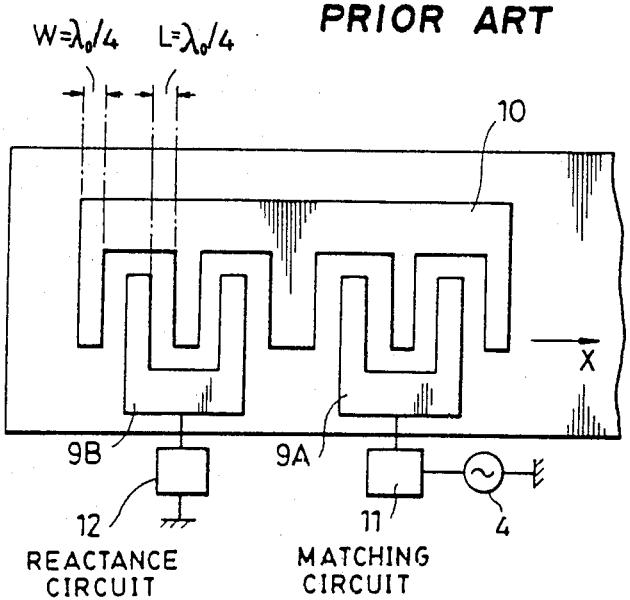
Figure 4:
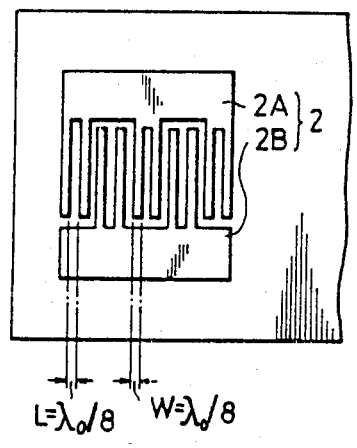

The invention will now be described in detail by way of a preferred embodiment referring to the drawings.

FIGS. 5(a) and 5(b) are a plan view and a sectional view showing a part of a surface acoustic wave device including an input transducer. The piezoelectric substrate 1 comprises an elastic substrate or plate 12 and a piezoelectric film 13 deposited on the elastic plate 12. A rectangular lower electrode 14 is formed on the elastic plate 12 while an upper electrode 15 consisting of plural comb-shaped electrodes 15A, 15B and 15C is provided on the piezoelectric film 13 and is confronted with or in other words located opposite the lower electrode 14. Thus, a so-called single phase transducer is made up. The comb-shaped electrodes 15A, 15B and 15C are provided at locations spaced in a direction X for propagation of surface acoustic waves and the respective centers thereof are spaced by $l_1$ or $l_2$. Both distances $l_1$ and $l_2$ are integer multiples of $\lambda_0/3$, respectively. For example, $l_1$ is $(\lambda_0/3) \cdot n_1$ while $l_2$ is $(\lambda_0/3) \cdot n_2$. The number of the comb-shaped electrodes is at least three. The width W of each electrode finger of the comb-shaped electrodes 15A, 15B and 15C and the distance L between the respective adjacent electrode fingers are $\lambda_0/2$, respectively.

As evident from FIG. 5(a), the electrodes 15A, 15B and 15C will not physically overlap so long as:

$$l_1 > \frac{N_1}{2} \lambda_o + \frac{N_2}{2} \lambda_o + 2\left(\frac{\lambda_o}{4}\right) \quad (1)$$

$$l_2 > \frac{N_2}{2} \lambda_o + \frac{N_3}{2} \lambda_o + 2\left(\frac{\lambda_o}{4}\right)$$

where $N_1$, $N_2$ and $N_3$ are the number of spaces between the electrode fingers of the electrodes 15A, 15B and 15C, respectively.

As mentioned above, $l_1 = n_1 \cdot \lambda_0/3$ and $l_2 = n_2 \cdot \lambda_0/3$, and the equations (1) can thus be rewritten:

$$\frac{\lambda_o}{3} n_1 > \frac{N_1}{2} \lambda_o + \frac{N_2}{2} \lambda_o + \frac{\lambda_o}{2} \quad (2)$$

$$\frac{\lambda_o}{3} n_2 > \frac{N_2}{2} \lambda_o + \frac{N_3}{2} \lambda_o + \frac{\lambda_o}{2}$$

Solving the equations (2) for $n_1$ and $n_2$ provides a definition of the lower limits thereof:

$$n_1 > 1.5(N_1 + N_2 + 1) \quad (3)$$
$$n_2 > 1.5(N_2 + N_3 + 1)$$

The output transducer not shown in the Figure is identically designed.

With this arrangement, when electric signals are applied to the comb-shaped electrodes 15A, 15B and 15C at 120° phase difference by a signal source 16 which is connected between the upper electrode 15 and the lower electrode 14, electric fields are generated between the lower electrode 14 and the respective comb-shaped electrodes 15A, 15B and 15C of the upper electrode 15, whereby surface acoustic waves are excited from the respective comb-shaped electrodes 15A, 15B and 15C.

The surface acoustic waves from the comb-shaped electrodes travel in both the right and left directions. In this case, since the distances between the respective electrodes and the phases of the signals applied to the respective electrodes are selected so as to satisfy a specific condition, the surface acoustic waves travelling in the $-X$ direction differ from each other in their phases by 120° while the waves travelling in the X direction all coincide in their phases.

That is, because the surface acoustic waves travelling in the $-X$ direction counteract each other while the waves travelling in the X direction enforce each other, the transducer allows the surface acoustic waves to propagate merely in the X direction.

The value $\lambda_0/2$ of the electrode finger width W and the electrode finger spacing distance L of the respective comb-shaped electrodes 15A, 15B and 15C is two times or four times the value of the conventional normalized electrode or double electrode. Therefore, great accuracy is not required upon making the electrodes. This leads to improvement of productivity and reduction of the production cost of the device. In particular, transducers for use in a high frequency band can be manufactured easily.

Figure 6:
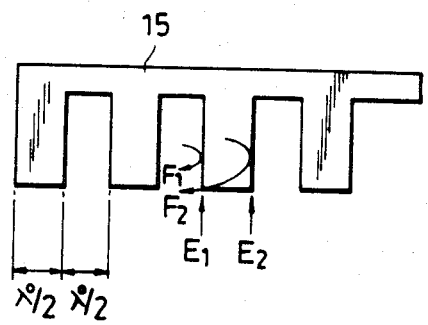
FIG. 6 shows an enlarged part of the electrode of the embodiment of FIG. 5(a)

Due to the value $\lambda_0/2$ of the electrode finger distance L, reflecting waves $F_1$ and $F_2$ (FIG. 6) produced at the respective electrode finger tips $E_1$ and $E_2$ differ in their phases by 180° so as to be in the opposite phases, and thereby counteract each other. Therefore, influences by interelectrode reflection is reduced to an extent to ensure the mono-directional property of the transducer.

Figure 7:
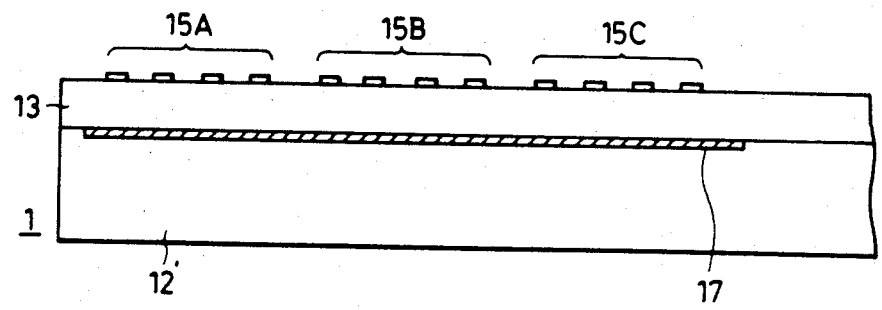
FIG. 7 shows a further embodiment of the invention.

FIG. 7 shows a further embodiment of the invention wherein a semiconductive substrate 12' is employed. In this case, a low resistance zone 17 is formed by doping impurities into a given region of the semiconductive substrate 12' so as to produce the lower electrode. Then, a conductive film to function as the lower electrode may be omitted. Further, use of the semiconductive substrate enables incorporation of other integrated circuits into the substrate of the surface acoustic wave device, thereby enlarging employment of the device.

The piezoelectric film 13 may be made of zinc oxide (ZnO), aluminium nitride (AlN), etc. by the sputtering, CVD or other similar method.

The comb-shaped electrodes constituting the upper electrode may be more than the three employed in the described embodiment, provided respective electrodes are spaced by integer multiple of $\lambda_0/3$.

The embodiments of the invention in which an exclusive property or privilege is claimed are defined as follows:

1. A surface acoustic wave device, comprising: an elastic substrate; a lower electrode provided on a surface of said elastic substrate; a piezoelectric film covering said lower electrode; and a plurality of upper electrodes provided on a surface of said piezoelectric film opposite said lower electrode; wherein said elastic substrate is made of a semiconductive material; wherein said elastic substrate made of said semiconductive material has a low resistance zone which functions as said lower electrode; wherein said upper electrodes, in response to application of an electrical input signal thereto, produce a surface acoustic wave in said piezoelectric film which propagates therethrough in a direction of propagation parallel to said surface on said elastic substrate, wherein said upper electrodes are comb-shaped electrodes which each have a plurality of electrode fingers which extend transversely to and are spaced in a direction parallel to said direction of propagation of the surface acoustic wave, wherein said upper electrodes each have a center which is intermediate the outermost electrode fingers thereof in a direction parallel to said direction of propagation, and wherein the centers of adjacent upper electrodes are spaced from each other in said direction of propagation of the surface acoustic wave by a distance which is an integer multiple of one third of the wavelength of a center frequency of the surface acoustic wave.

2. A surface acoustic wave device as set forth in claim 1, wherein each said comb-shaped upper electrode is designed so that the width of each said electrode finger thereof and the distance between adjacent electrode fingers thereof are one half of said wavelength of said center frequency.

3. A surface acoustic wave device as set forth in claim 2, wherein there are three of said comb-shaped upper electrodes, and wherein said electrical input signal is a three-phase signal having first, second and third phases which are respectively applied to a first, a second and a third of said upper electrodes, said second of said upper electrodes being between said first and third of said upper electrodes and being spaced in said direction of propagation from said first of said upper electrodes, and said second and third phases of said input signal respectively lagging said first and second phases thereof by a phase shift of 120°.

4. In a surface acoustic wave device which includes: an elastic substrate; a lower electrode provided on a surface of said elastic substrate; a piezoelectric film covering said lower electrode; and a plurality of upper electrodes provided on a surface of said piezoelectric film opposite said lower electrode, the improvement comprising wherein said upper electrodes, in response to application of an electrical signal thereto, produce a surface acoustic wave in said piezoelectric film which propagates therethrough in a direction of propagation parallel to said surface on said elastic substrate, wherein said upper electrodes are each a comb-shaped electrode having a plurality of spaced electrode fingers which extend transversely to and are spaced in a direction parallel to said direction of propagation of the surface acoustic wave, wherein said upper electrodes each have a center which is intermediate the outermost electrode fingers thereof in a direction parallel to said direction of propagation, said upper electrodes being spaced from each other in said direction of propagation of the surface acoustic wave so that the centers of adjacent upper electrodes are spaced in said direction of propagation by a distance which is an integer multiple of one-third of the wavelength of a center frequency of the surface acoustic wave; and wherein each said comb-shaped upper electrode is designed so that the width of each said electrode finger thereof and the distance between adjacent said electrode fingers thereof is one-half of the wavelength of said center frequency.

5. A surface acoustic wave device as set forth in claim 6, wherein there are three of said comb-shaped upper electrodes, and wherein said electrical input signal is a three-phase signal having first, second and third phases which are respectively applied to a first, a second and a third of said upper electrodes, said second of said upper electrodes being between said first and third of said upper electrodes and being spaced in said direction of propagation from said first of said upper electrodes, and said second and third phases of said input signal respectively lagging said first and second phases thereof by a phase shift of 120°.

6. A surface acoustic wave device as set forth in claim 4, wherein said elastic substrate is made of a semiconductive material.

7. A surface acoustic wave device as set forth in claim 6, wherein said elastic substrate made of said semiconductive material has a low resistance zone which functions as said lower electrode.

8. In a surface acoustic wave device which includes: an elastic substrate; a piezoelectric film provided on a surface of said elastic substrate; and unidirectional input transducer means responsive to application thereto of an electrical input signal for causing a surface acoustic wave to be introduced into said piezoelectric film and to propagate therethrough in a direction of propagation along a propagation path which is parallel to said surface on said substrate, said unidirectional input transducer means including a plurality of first electrodes provided on a side of said piezoelectric film remote from said elastic substrate and a second electrode provided between said piezoelectric film and said elastic substrate opposite said first electrodes; the improvement comprising wherein each of said first electrodes is comb-shaped and has a plurality of electrode fingers which are spaced from each other in a direction parallel to said propagation path and which each extend approximately perpendicular to said propagation path, wherein said first electrodes are provided at respective locations along said propagation path and are spaced from each other in a direction parallel to said propagation path, each of said first electrodes having a center which is intermediate the outermost electrode fingers thereof in a direction parallel to said direction of propagation and the centers of each adjacent pair of said first electrodes being spaced by a distance which is an integer multiple of one-third of the wavelength at a center frequency of said surface acoustic wave; and wherein each said electrode finger has a width in a direction parallel to said propagation path which is one-half of said wavelength of said center frequency of said surface acoustic wave, and each adjacent pair of said electrode fingers on each of said first electrodes is separated by a space which has a width in a direction parallel to said propagation path which is one-half of said wavelength of said center frequency of said surface acoustic wave.

9. A surface acoustic wave device as set forth in claim 8, wherein there are three of said first electrodes, wherein there are four of said electrode fingers on each of said first electrodes, and wherein said electrical input signal is a three-phase signal having first, second and third phases which are respectively applied to a first of said first electrodes, a second of said first electrodes and a third of said first electrodes, said second of said first electrodes being between said first and third of said first electrodes and being spaced in said direction of propagation from said first of said first electrodes, and said second and third phases of said input signal respectively lagging said first and second phases thereof by a phase shift of 120°.

10. A surface acoustic wave device as set forth in claim 8, wherein said elastic substrate is made of a semiconductive material and has a low resistance zone which serves as said second electrode.

11. A surface acoustic wave device as set forth in claim 8, wherein said piezoelectric film is made of zinc oxide.

12. A surface acoustic wave device as set forth in claim 8, wherein said piezoelectric film is made of aluminum nitride.

* * * * *

UNITED STATES PATENT AND TRADEMARK OFFICE
CERTIFICATE OF CORRECTION

PATENT NO. : 4 602 183

DATED : July 22, 1986

INVENTOR(S) : Takeshi OKAMOTO et al

It is certified that error appears in the above-identified patent and that said Letters Patent is hereby corrected as shown below:

Column 5, lines 57-58; change "claim 6" to ---claim 4---.

Signed and Sealed this

Twenty-seventh Day of January, 1987

Attest:

DONALD J. QUIGG

Attesting Officer  Commissioner of Patents and Trademarks